US 12,148,608 B2

(12) United States Patent
Vaniapura et al.

(10) Patent No.: US 12,148,608 B2
(45) Date of Patent: Nov. 19, 2024

(54) POST ETCH DEFLUORINATION PROCESS

(71) Applicants: Mattson Technology, Inc., Fremont, CA (US); Beijing E-Town Semiconductor Technology Co., Ltd., Beijing (CN)

(72) Inventors: Vijay Vaniapura, Tracy, CA (US); Andrei Gramada, Fresno, CA (US)

(73) Assignees: Beijing E-Town Semiconductor Technology Co., Ltd., Beijing (CN); Mattson Technology, Inc., Fremont, CA (US)

( * ) Notice: Subject to any disclaimer, the term of this patent is extended or adjusted under 35 U.S.C. 154(b) by 719 days.

(21) Appl. No.: 17/128,370

(22) Filed: Dec. 21, 2020

(65) Prior Publication Data

US 2021/0111017 A1 Apr. 15, 2021

Related U.S. Application Data

(63) Continuation of application No. 16/403,722, filed on May 6, 2019, now Pat. No. 10,872,761.

(Continued)

(51) Int. Cl.
*H01L 21/02* (2006.01)
*H01L 21/3065* (2006.01)
*H01L 21/311* (2006.01)

(52) U.S. Cl.
CPC .... *H01L 21/02076* (2013.01); *H01L 21/3065* (2013.01); *H01L 21/311* (2013.01)

(58) Field of Classification Search
CPC ........... H01L 21/02076; H01L 21/3065; H01L 21/311; H01L 21/02071; H01L 21/31138;
(Continued)

(56) References Cited

U.S. PATENT DOCUMENTS 5,380,401 A 1/1995 Jones et al.
6,566,269 B1 5/2003 Biles et al.
(Continued)

FOREIGN PATENT DOCUMENTS

CN 101211753 7/2008
CN 108155144 A 6/2018
(Continued)

OTHER PUBLICATIONS

PCT International Search Report and Written Opinion for corresponding PCT Application No. PCT/US2019/031001, dated Aug. 19, 2019, 12 pages.
(Continued)

*Primary Examiner* — Kyoung Lee
*Assistant Examiner* — Christina A Sylvia
(74) *Attorney, Agent, or Firm* — Dority & Manning, P.A.

(57) ABSTRACT

Defluorination processes for removing fluorine residuals from a workpiece such as a semiconductor wafer are provided. In one example implementation, a method for processing a workpiece can include supporting a workpiece on a workpiece support. The workpiece can have a photoresist layer. The workpiece can have one or more fluorine residuals on a surface of the workpiece. The method can include performing a defluorination process on the workpiece at least in part using a plasma generated from a first process gas. The first process gas can include a hydrogen gas. Subsequent to performing the defluorination process, the method can include performing a plasma strip process on the workpiece to at least partially remove a photoresist layer from the workpiece.

16 Claims, 8 Drawing Sheets

Related U.S. Application Data

(60) Provisional application No. 62/689,475, filed on Jun. 25, 2018.

(58) Field of Classification Search
CPC .............. H01L 21/0206; H01L 21/027; H01L 21/31116; H01L 21/32136; H01L 21/324; H01L 21/67069; H01J 37/32009
See application file for complete search history.

(56) References Cited

U.S. PATENT DOCUMENTS

| | | | |
|---|---|---|---|
| 6,951,823 B2 | 10/2005 | Waldfried et al. | |
| 7,049,209 B1 | 5/2006 | Dalton et al. | |
| 7,226,852 B1* | 6/2007 | Li | H01L 21/02063 |
| | | | 438/689 |
| 7,244,313 B1 | 7/2007 | Zhou et al. | |
| 7,977,244 B2 | 7/2011 | Lai et al. | |
| 8,642,483 B2* | 2/2014 | Honda | H01L 21/31144 |
| | | | 438/694 |
| 8,991,333 B2 | 3/2015 | Tozawa | |
| 9,039,911 B2 | 5/2015 | Hudson et al. | |
| 9,076,860 B1 | 7/2015 | Lei et al. | |
| 9,390,923 B2 | 7/2016 | Yoo et al. | |
| 9,570,582 B1 | 2/2017 | Bao et al. | |
| 2002/0033233 A1* | 3/2002 | Savas | H01J 37/321 |
| | | | 156/345.48 |
| 2006/0040066 A1 | 2/2006 | Tsutae | |
| 2011/0168205 A1 | 7/2011 | Tahara et al. | |
| 2014/0051255 A1 | 2/2014 | Fang et al. | |
| 2014/0060572 A1 | 3/2014 | Yasumuro et al. | |
| 2015/0072538 A1* | 3/2015 | Spurlin | H01L 21/02068 |
| | | | 438/798 |
| 2016/0336197 A1 | 11/2016 | Kobayashi et al. | |
| 2016/0358784 A1* | 12/2016 | Hudson | H01L 21/67069 |

FOREIGN PATENT DOCUMENTS

| | | |
|---|---|---|
| JP | H11-305453 | 11/1999 |
| JP | 2004273532 | 9/2004 |
| JP | 2005217292 | 8/2005 |
| JP | 2012-230936 | 11/2012 |
| KR | 19990084312 | 12/1999 |
| KR | 20040009506 | 1/2004 |
| KR | 20070057224 | 6/2007 |
| KR | 20090026253 | 3/2009 |
| KR | 20110081765 | 7/2011 |
| KR | 20140027895 | 3/2014 |
| KR | 20140029289 | 3/2014 |

OTHER PUBLICATIONS

International Preliminary Report on Patentability for Application No. PCT/US2019/031001, dated Jan. 7, 2021, 9 pages.
International Preliminary Report of Patentability for PCT/US2019/031001, dated Jan. 7, 2021, 9 pages.

* cited by examiner

POST ETCH DEFLUORINATION PROCESS

PRIORITY CLAIM

This application is a continuation of U.S. patent application Ser. No. 16/403,722, filed May 6, 2018 which claims the benefit of priority of U.S. Provisional Patent Application Ser. No. 62/689,475, titled "Post Etch Defluorination Process, filed on Jun. 25, 2018, which is incorporated herein by reference for all purposes.

FIELD

The present disclosure relates generally to semiconductor processing and more particularly, to post etch defluorination processes to be implemented prior to plasma strip processes in semiconductor processing.

BACKGROUND

Plasma strip processes (e.g., dry strip processes) can be used in semiconductor fabrication as a method for removing photoresist and/or other materials patterned on a workpiece during semiconductor fabrication. Plasma strip processes can use reactive species (e.g., radicals) extracted from a plasma generated from one or more process gases to etch and/or remove photoresist and other mask layers from a surface of a workpiece. For instance, in some plasma strip processes, neutral species from a plasma generated in a remote plasma chamber pass through a separation grid into a processing chamber. The neutral species can be exposed to a workpiece, such as a semiconductor wafer, to remove photoresist from the surface of the workpiece.

SUMMARY

Aspects and advantages of embodiments of the present disclosure will be set forth in part in the following description, or may be learned from the description, or may be learned through practice of the embodiments.

One example aspect of the present disclosure is directed to a method for processing a workpiece, such as a semiconductor wafer. The method can include supporting a workpiece on a workpiece support. The workpiece can have a photoresist layer. The workpiece can have one or more fluorine residuals on a surface of the workpiece. The method can include performing a defluorination process on the workpiece at least in part using a plasma generated from a first process gas. The first process gas can include a hydrogen gas. Subsequent to performing the defluorination process, the method can include performing a plasma strip process on the workpiece to at least partially remove a photoresist layer from the workpiece.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
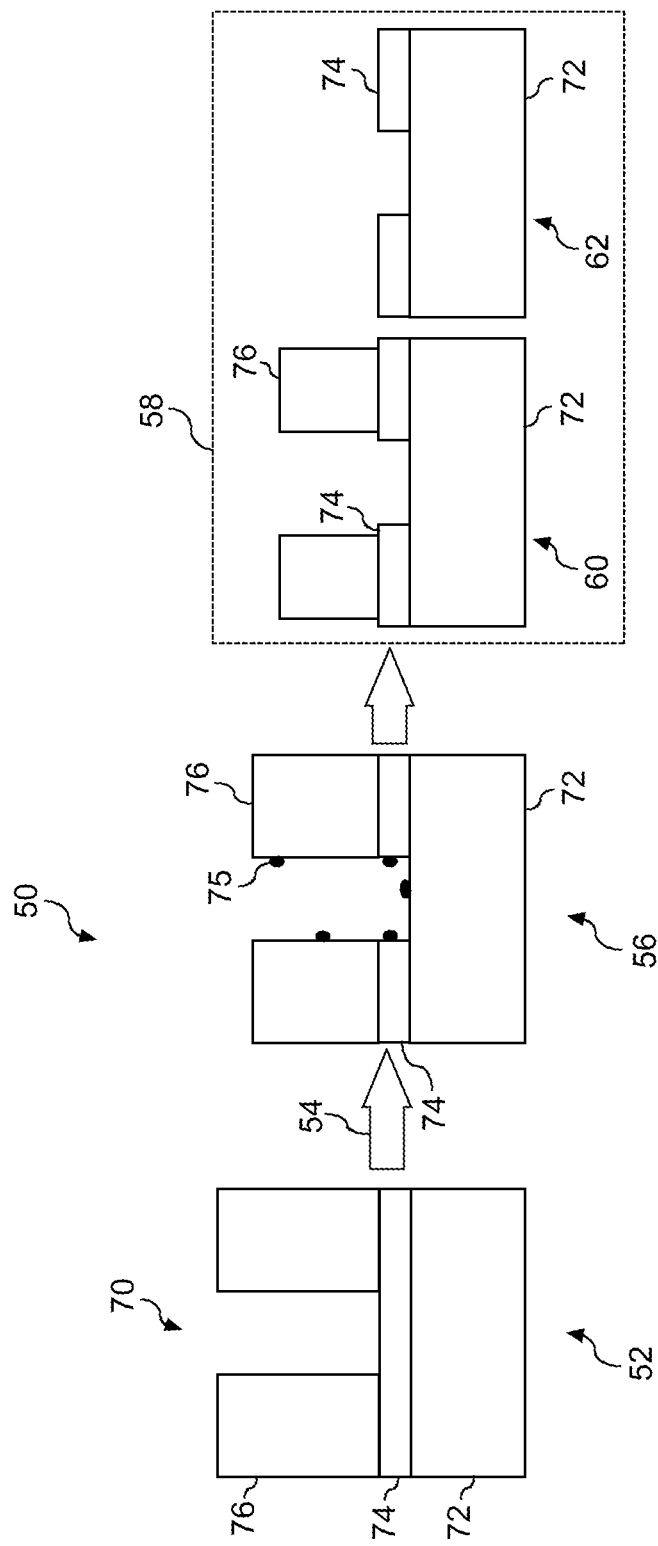
FIG. 1 depicts an overview of an example process according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to methods for processing a workpiece to reduce fluorine residuals (e.g., post etch fluorine residuals). Plasma strip processes (e.g., dry strip processes) can be used for the removal of photoresist and/or other mask materials during semiconductor fabrication processes. For instance, reactive species extracted from a plasma can be used to etch and/or remove a photoresist on a surface of a workpiece, such as a semiconductor wafer.

In some cases, residual fluorine can be present on the workpiece (e.g., after conducting an etch process with a fluorine chemistry). Oxygen based plasmas used during plasma strip processes can react with the fluorine residuals to etch underlying layer materials on a workpiece. When metal layers are exposed on the workpiece during the plasma strip process, the residual fluorine can generate volatile metal components and can potentially contaminate the processing chamber. Metal contamination can affect the stability of the chamber due to reactive species loss to increased recombination.

For example, a plasma strip process can be used to remove a layer of photoresist over exposed tungsten. During an oxygen-based plasma strip process, residual fluorine from prior etch processes (e.g., etch processes implemented with a fluorine chemistry) can react with the oxygen and tungsten to form volatile tungsten oxides and oxy-fluorides. The tungsten oxides and oxy-fluorides can be deposited on cooler portions of a plasma processing apparatus. Accumulation of the tungsten compounds can lead to increased recombination of oxygen radicals during an oxygen-based plasma strip process, resulting in a reduced photoresist strip rate during the plasma strip process. Fluorine can also be released from a workpiece surface during workpiece heating and can be adhered to portions of the plasma processing apparatus, affecting plasma strip process performance.

Example aspects of the present disclosure are directed to conducting a defluorination process on a workpiece prior to implementing a plasma strip process. The defluorination process can be performed in-situ in the same processing chamber as the plasma strip process. The defluorination process can expose the workpiece to one or more hydrogen radicals. The hydrogen radicals can react with the fluorine residuals to generate HF molecules (e.g., HF gas). The HF molecules can be evacuated from a processing chamber. The plasma strip process can then be implemented to remove the photoresist (e.g., using an oxygen-based plasma). In this way, effects resulting from the presence of one or more fluorine residuals during a plasma strip process can be reduced.

In some embodiments, the hydrogen radicals can be generated in a plasma chamber that is separated from the processing chamber by a separation grid. The hydrogen radicals can be generated, for instance, by inducing a plasma in a process gas. The process gas, for instance, can be a mixture including $H_2$ and a carrier gas, such as a mixture including $H_2$ and $N_2$, or can be a mixture including $H_2$ and He, or can be a mixture including $H_2$ and Ar, or can be a mixture including $H_2$ and Ar and another inert gas. In some other embodiments, the hydrogen radicals can be generated, for instance, using a heated filament, such as a heated tungsten filament.

In some other embodiments, the hydrogen radicals can be generated using post-plasma gas injection. For instance, one or more excited inert gas molecules (e.g., excited He molecules) can be generated in a plasma chamber that is separated from a processing chamber by a separation grid. The excited inert gas molecules can be generated, for instance, by inducing a plasma in a process gas using a plasma source (e.g., inductive plasma source, capacitive plasma source, etc.). The process gas can be an inert gas. For instance, the process gas can be helium, argon, xenon, neon, or other inert gas. In some embodiments, the process gas can consist of an inert gas. A separation grid can be used to filter ions generated in the plasma chamber and allow passage of neutral species through holes in the separation grid to the processing chamber for exposure to the workpiece.

In some embodiments, the hydrogen radicals can be generated by mixing hydrogen gas ($H_2$) with the excited species at or below (e.g., downstream) the separation grid. For instance, in some embodiments, the separation grid can have a plurality of grid plates. The hydrogen gas can be injected into species passing through the separation grid at a location below or downstream of one of the grid plates. In some embodiments, the hydrogen gas can be injected into species passing through the separation grid at a location between two grid plates. In some embodiments, the hydrogen gas can be injected into the species at a location beneath all of the grid plates (e.g., in the processing chamber).

Mixing the hydrogen gas with the excited species from the inert gas can result in the generation of one or more hydrogen radicals, such as neutral hydrogen radicals. The hydrogen radicals can be exposed to a workpiece in the processing chamber to implement the defluorination processes according to example embodiments of the present disclosure.

Example aspects of the present disclosure provide a number of technical effects and benefits. For instance, in-situ treatment of a workpiece (e.g., in the same processing chamber as the plasma strip process) with one or more hydrogen radicals can reduce the accumulation of tungsten compounds and subsequent drop in strip rate attributable to the presence of fluorine residuals on the workpiece during the plasma strip process.

Aspects of the present disclosure are discussed with reference to a "workpiece" "wafer" or semiconductor wafer for purposes of illustration and discussion. Those of ordinary skill in the art, using the disclosures provided herein, will understand that the example aspects of the present disclosure can be used in association with any semiconductor substrate or other suitable substrate. In addition, the use of the term "about" in conjunction with a numerical value is intended to refer to within ten percent (10%) of the stated numerical value. A "pedestal" refers to any structure that can be used to support a workpiece.

FIG. 1 depicts an overview of an example process 50 according to example embodiments of the present disclosure. At stage 52, a workpiece 70 can include a substrate layer 72 (e.g., silicon and/or silicon germanium). A layer 74 to be etched (e.g., a dielectric layer, such as a silicon dioxide layer, or metal layer, such as tungsten) can be disposed on top of substrate layer 72. A layer of photoresist 76 can be patterned on the workpiece 70. The layer of photoresist 76 can be patterned to serve as a mask for etching layer 74 during an etch process.

The process 50 implements an etch process 54 to remove a portion of layer 74. The etch process 54 can, in some embodiments, be a fluorine based etch process where fluorine, fluorine containing compounds, fluorine species, and/or fluorine mixtures are used to etch the exposed portion of layer 74. As illustrated at stage 56, fluorine residuals 75 can remain on the workpiece 70 after completion of the etch process 54.

Figure 2:
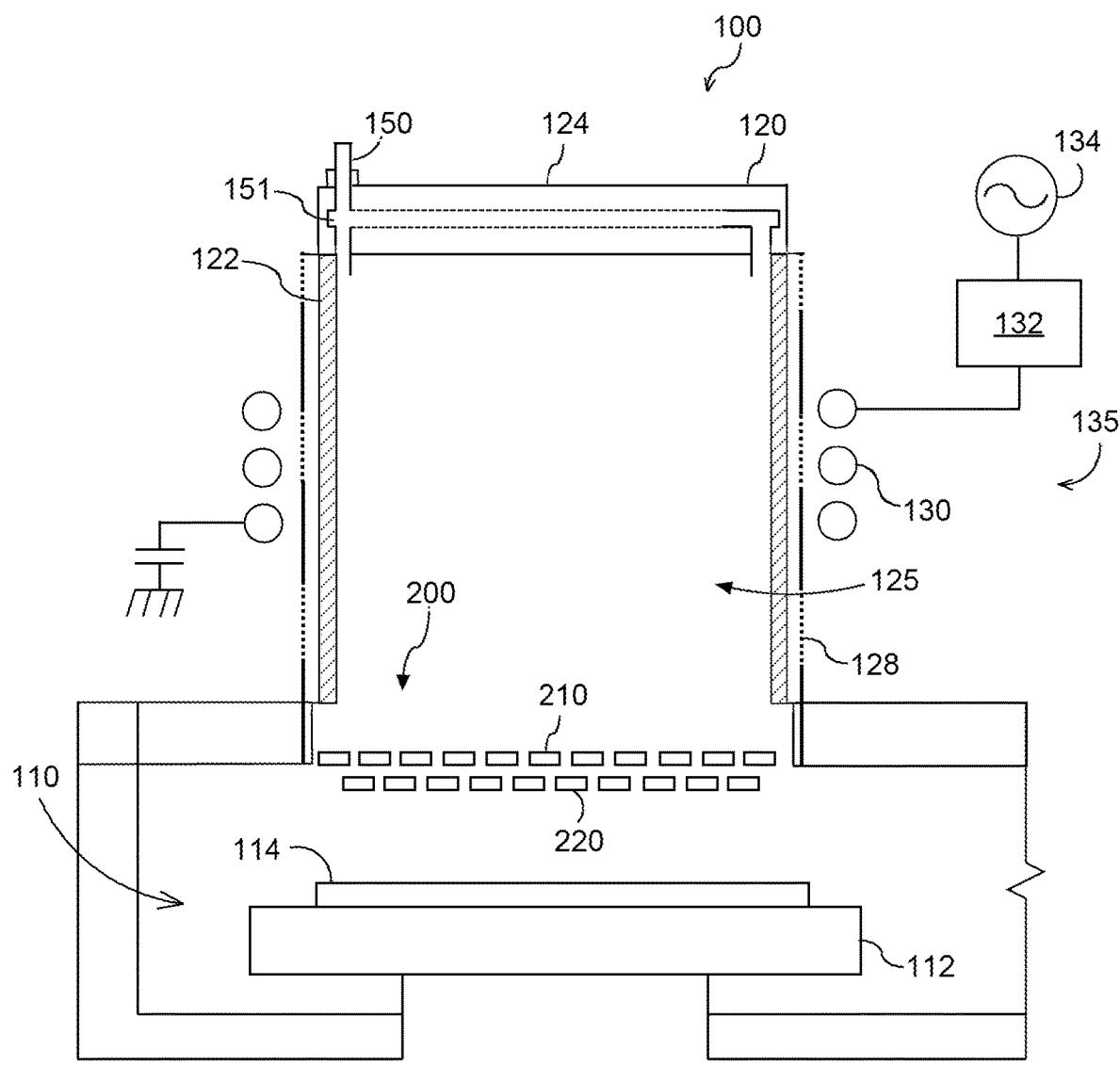
FIG. 2 depicts an example plasma processing apparatus according to example embodiments of the present disclosure.
Figure 7:
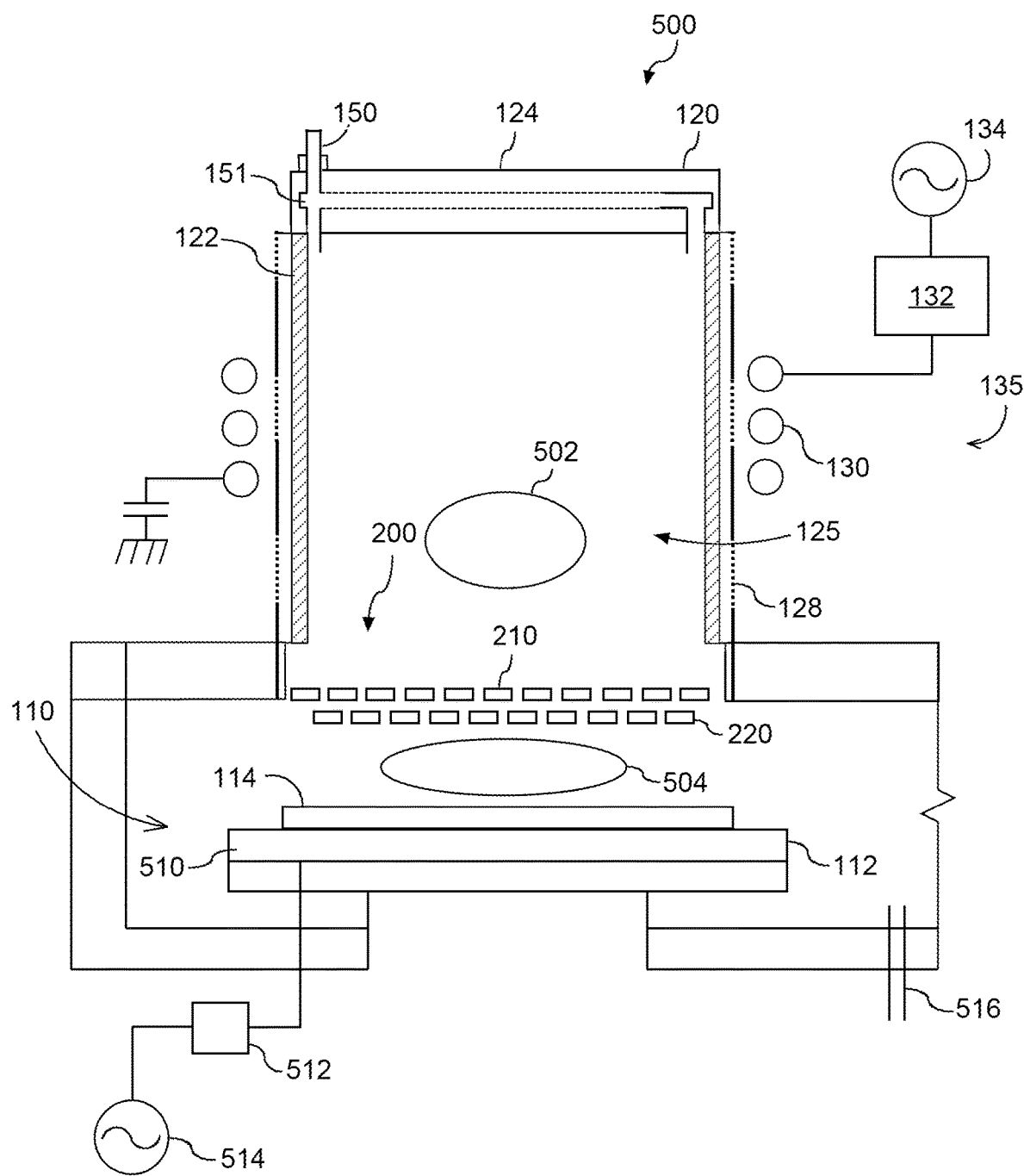
FIG. 7 depicts an example plasma processing apparatus according to example embodiments of the present disclosure.
Figure 8:
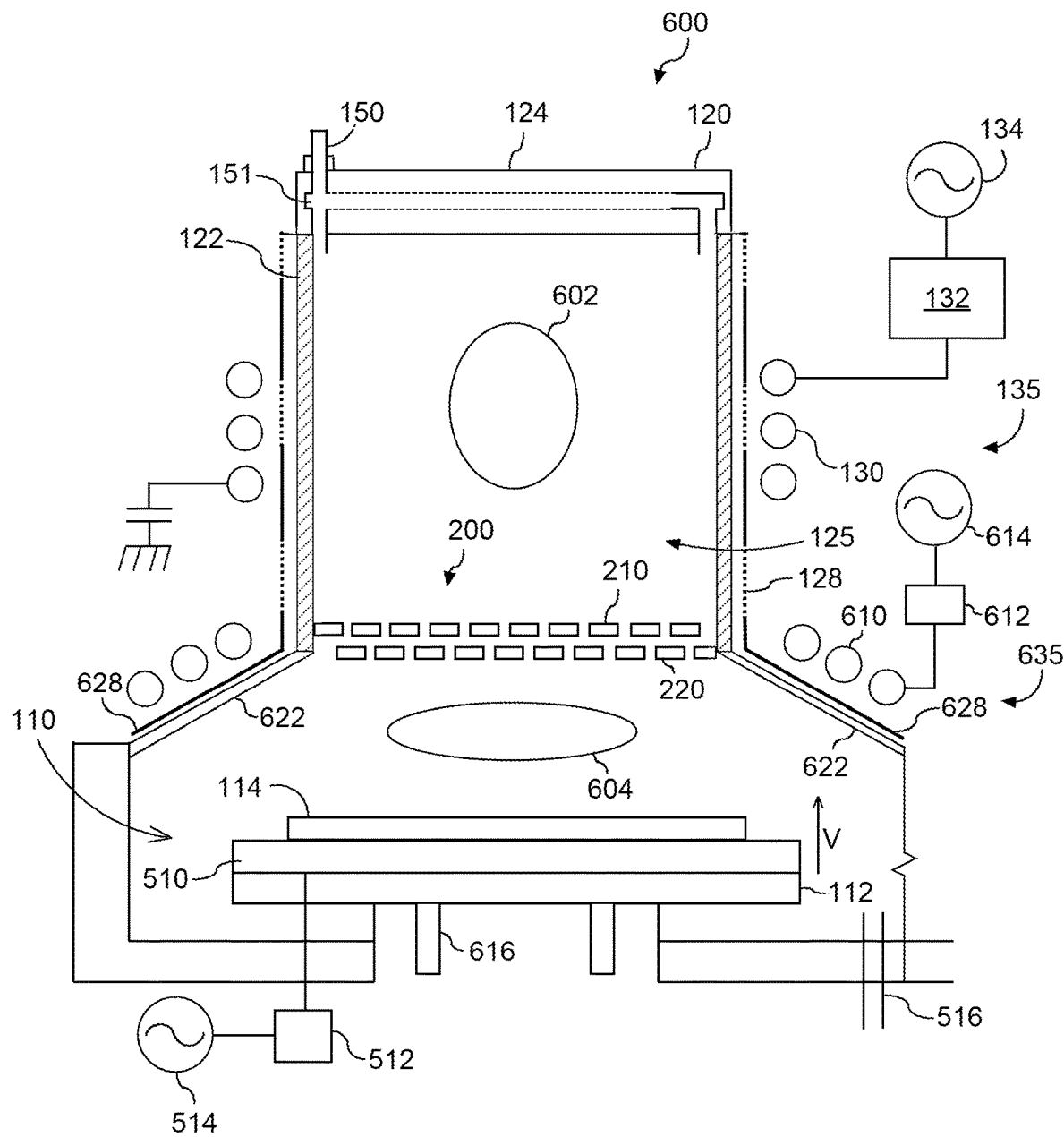
FIG. 8 depicts an example plasma processing apparatus according to example embodiments of the present disclosure.

A photoresist removal process 58 can be implemented in a plasma processing apparatus (e.g., the apparatus of FIG. 2, 7, or 8). According to example embodiments of the present disclosure, the photoresist removal process 58 can include a defluorination process and a plasma strip process.

According to example embodiments of the present disclosure, the defluorination process can include exposing the workpiece 70 to hydrogen radicals. The hydrogen radicals react with the fluorine residuals to generate HF. The HF can be removed from the processing chamber of the plasma processing apparatus. At stage 60, the workpiece 70 has been treated to remove the fluorine residuals 75.

As will be discussed in more detail below, in some embodiments, the defluorination process can be implemented by generating a plasma from a process gas using a plasma source, such as an inductively coupled plasma source. The process gas can include hydrogen. The plasma can generate hydrogen radicals. Neutral hydrogen radicals can pass through a separation grid to a processing chamber where they are exposed to the workpiece. The hydrogen radicals can react with the fluorine residuals to reduce the fluorine residuals on the workpiece. Other sources of hydrogen radicals can be used, such as steam.

Example process parameters for a defluorination process according to example embodiments of the present disclosure include:

Process Gas: $H_2$ and carrier gas (e.g., $N_2$ or Ar or He or combination) (or other sources of H radicals, such as steam)

$H_2$ ratio to carrier gas: about 2 to about 100

Treatment Time: about 5 seconds to about 60 seconds
Process Pressure: about 300 mTorr to about 4000 mTorr
Inductively Coupled Plasma Source Power: about 600 W to about 5000 W
Workpiece Temperature: about 90° C. to about 400° C.

Referring to FIG. 1, subsequent to the defluorination process, the photoresist removal process 58 can include a plasma strip process. The plasma strip process can expose the workpiece 70 to radicals (e.g., generated from a process gas using a plasma source) to etch and/or remove the photoresist layer 76. Stage 62 depicts the workpiece 70 after removal of the photoresist layer 76.

Example process parameters for the plasma strip process can include:
Process Gas: $O_2$, or $O_2$ and carrier gas (e.g., $N_2$ or Ar or He or combination)
Process Pressure: about 600 mTorr to about 1200 mTorr
Inductively Coupled Plasma Source Power: about 2000 W to about 5000 W
Workpiece Temperature: about 90° C. to about 400° C.

In some embodiments, the defluorination process can be performed in situ with the plasma strip process. For instance, the defluorination process and plasma strip process can be performed in the same processing chamber without having to remove the workpiece from the processing chamber.

FIG. 2 depicts an example plasma processing apparatus 100 that can be used to perform processes according to example embodiments of the present disclosure. As illustrated, plasma processing apparatus 100 includes a processing chamber 110 and a plasma chamber 120 that is separated from the processing chamber 110. Processing chamber 110 includes a workpiece support or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of substrate 114 through a separation grid assembly 200.

Aspects of the present disclosure are discussed with reference to an inductively coupled plasma source for purposes of illustration and discussion. Those of ordinary skill in the art, using the disclosures provided herein, will understand that any plasma source (e.g., inductively coupled plasma source, capacitively coupled plasma source, etc.) can be used without deviating from the scope of the present disclosure.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gases (e.g., a hydrogen gas and a carrier gas) can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 1, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded. In some embodiments, the grid assembly can include a single grid with one grid plate.

Figure 3:
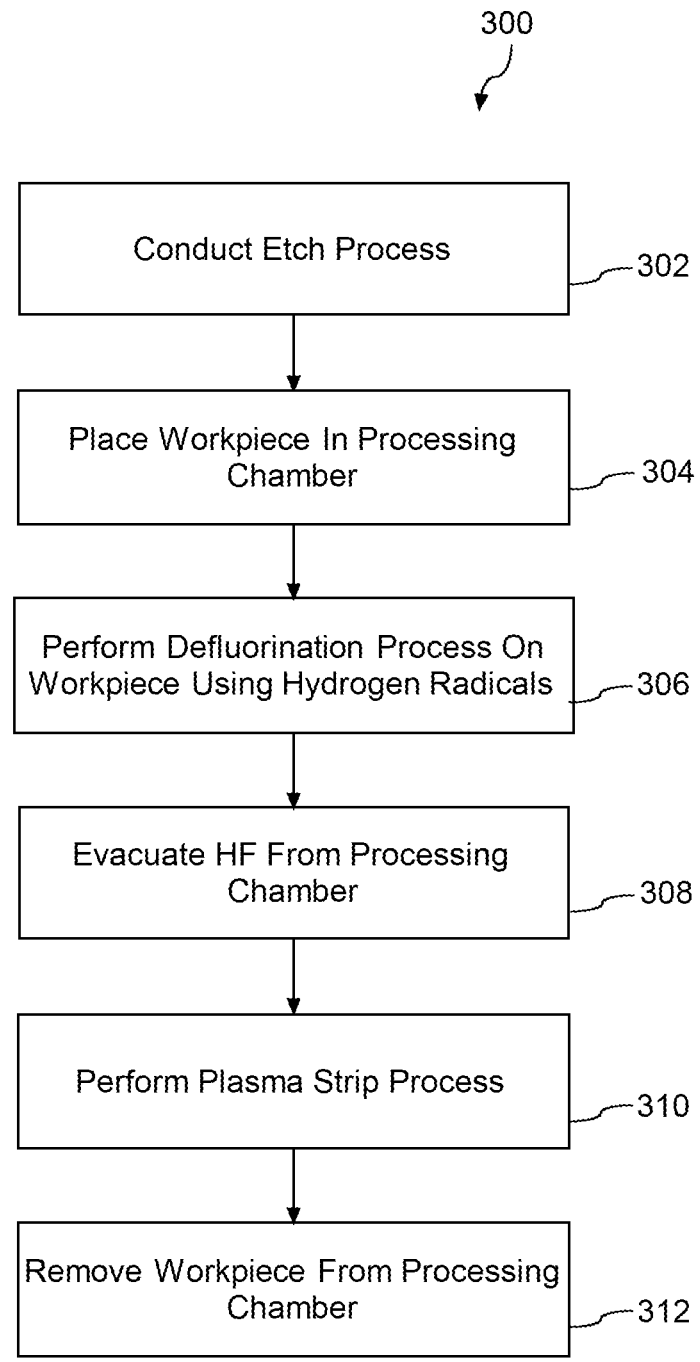
FIG. 3 depicts a flow diagram of an example method according to example embodiments of the present disclosure.

FIG. 3 depicts a flow diagram of one example method (300) according to example aspects of the present disclosure. The method (300) will be discussed with reference to the plasma processing apparatus 100 of FIG. 2 by way of example. The method (300) can be implemented in any suitable plasma processing apparatus. FIG. 3 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (302), the method can include conducting an etch process to etch a layer on a workpiece. The etch process can be carried out in a separate processing apparatus relative to the remainder of method (300). The etch process can remove at least a portion of a layer on the workpiece. In some embodiments, the etch process can be a fluorine-based etch process. The workpiece can have one or more fluorine residuals after implementation of the fluorine-based etch process.

At (304), the method can include placing a workpiece in a processing chamber of a plasma processing apparatus. The processing chamber can be separated from a plasma chamber (e.g., separated by a separation grid assembly). For instance, the method can include placing a workpiece 114 onto workpiece support 112 in the processing chamber 110.

Referring to FIG. 3, the method can include performing a defluorination process (306) according to example aspects of the present disclosure. The defluorination process can be any defluorination process disclosed herein. For instance, the defluorination process can be the example defluorination processes discussed with reference to FIGS. 4-6.

The defluorination process can expose a workpiece to one or more hydrogen radicals to react with fluorine residuals. For instance, the hydrogen radicals can react with the fluorine residuals to generate HF.

At (308), the method can include evacuating the HF from the processing chamber. For instance, HF gas generated as a result of the defluorination process can be pumped out of the processing chamber 110.

At (310), the method can include performing a plasma strip process, for instance, to remove photoresist from the workpiece. The plasma strip process can include, for instance, generating a plasma from a process gas in the plasma chamber 120, filtering ions with the separation grid assembly 200, and allowing neutral radicals to pass through the separation grid assembly 200. The neutral radicals can be exposed to the workpiece 114 to at least partially remove photoresist from the workpiece.

The process gas used during the plasma strip process at (310) can be different from the process gas used during the defluorination process at (308). For instance, the process gas during the defluorination process at (308) can include hydrogen gas. The process gas during the plasma strip process at (310) can include an oxygen gas.

At (312) of FIG. 3, the method can include removing the workpiece from the processing chamber. For instance, the workpiece 114 can be removed from workpiece support 112 in the processing chamber 110. The plasma processing apparatus can then be conditioned for future processing of additional workpieces. In this way, both the defluorination process (308) and the plasma strip process (310) can be performed using the same processing apparatus while the workpiece is in the same processing chamber.

Figure 4:
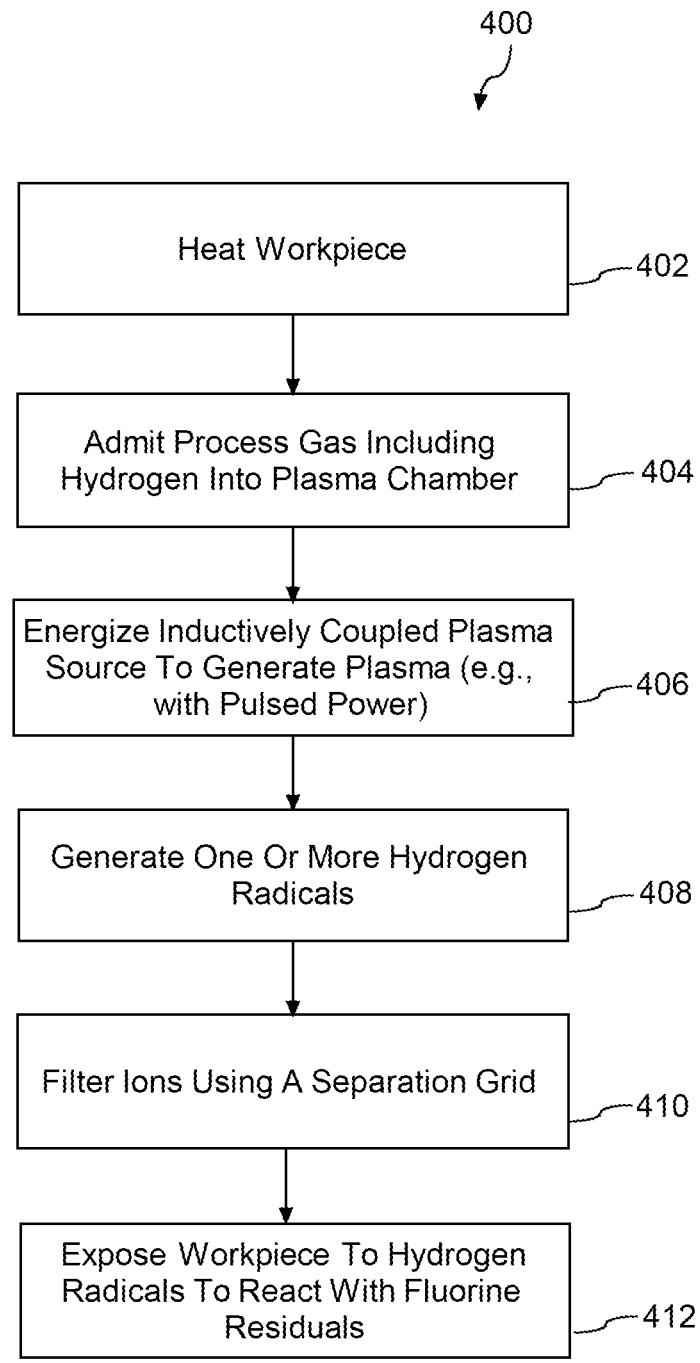
FIG. 4 depicts example flow diagram of an example defluorination process according to example embodiments of the present disclosure.

FIG. 4 depicts a flow diagram of an example defluorination process (400) according to example aspects of the present disclosure. The process (400) can be implemented using the plasma processing apparatus 100. However, as will be discussed in detail below, the methods according to example aspects of the present disclosure can be implemented using other approaches without deviating from the scope of the present disclosure. FIG. 4 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various additional steps (not illustrated) can be performed without deviating from the scope of the present disclosure.

At (402), the defluorination process can include heating the workpiece. For instance, the workpiece 114 can be heated in the process chamber to a process temperature. The workpiece 114 can be heated, for instance, using one or more heating systems associated with the pedestal 112. In some embodiments, the workpiece can be heated to a process temperature in the range of about 90° C. to about 400° C.

At (404), the defluorination process can include admitting a process gas into the plasma chamber. For instance, a process gas can be admitted into the plasma chamber interior 125 from a gas source 150 via annular gas distribution channel 151 or other suitable gas introduction mechanism. In some embodiments, the process gas can include a hydrogen gas. For instance, the process gas can include $H_2$ and carrier gas (e.g., Na or Ar or He or other inert gas or combination). A ratio of $H_2$ to carrier gas can be about 2 to about 100.

At (406), the defluorination process can include energizing an inductively coupled plasma source to generate a plasma in a plasma chamber. For instance, induction coil 130 can be energized with RF energy from RF power generator 134 to generate a plasma in the plasma chamber interior 125. In some embodiments, the inductively coupled plasma source can be energized with pulsed power to obtain desired radicals with reduced plasma energy. In some embodiments, the inductively coupled plasma source can be operated with a power in the range of about 660 W to about 5000 W. The plasma can be used to generate one or more hydrogen radicals from the hydrogen gas at (408). Other sources of hydrogen radicals can be used, such as steam.

At (410), the defluorination process can include filtering one or more ions generated by the plasma to create a filtered mixture. The filtered mixture can include neutral hydrogen radicals. In some embodiments, the one or more ions can be filtered using a separation grid assembly separating the plasma chamber from a processing chamber where the workpiece is located. For instance, separation grid assembly 200 can be used to filter ions generated by the plasma. The separation grid 200 can have a plurality of holes. Charged particles (e.g., ions) can recombine on the walls in their path through the plurality of holes. Neutral species (e.g. radicals) can pass through the holes.

In some embodiments, the separation grid 200 can be configured to filter ions with an efficiency greater than or equal to about 90%, such as greater than or equal to about 95%. A percentage efficiency for ion filtering refers to the amount of ions removed from the mixture relative to the total number of ions in the mixture. For instance, an efficiency of about 90% indicates that about 90% of the ions are removed during filtering. An efficiency of about 95% indicates that about 95% of the ions are removed during filtering.

In some embodiments, the separation grid can be a multi-plate separation grid. The multi-plate separation grid can have multiple separation grid plates in parallel. The arrangement and alignment of holes in the grid plate can be selected to provide a desired efficiency for ion filtering, such as greater than or equal to about 95%.

For instance, the separation grid 200 can have a first grid plate 210 and a second grid plate 220 in parallel relationship with one another. The first grid plate 210 can have a first grid pattern having a plurality of holes. The second grid plate 220 can have a second grid pattern having a plurality of holes. The first grid pattern can be the same as or different from the second grid pattern. Charged particles (e.g., ions) can recombine on the walls in their path through the holes of each grid plate 210, 220 in the separation grid 200. Neutral species (e.g., radicals) can flow relatively freely through the holes in the first grid plate 210 and the second grid plate 220.

At (412) of FIG. 4, the defluorination process can include exposing the workpiece to the hydrogen radicals. More particularly, the workpiece can be exposed to hydrogen radicals generated in the plasma and passing through the separation grid assembly. As an example, hydrogen radicals can pass through the separation grid 200 and be exposed to the workpiece 114. Exposing the workpiece to hydrogen radicals can result in removal of one or more fluorine residuals from the workpiece.

The defluorination process can be implemented by generating hydrogen radicals using other approaches without deviating from the scope of the present disclosure. For instance, in some embodiments, the hydrogen radicals can be generated at least in part using post-plasma gas injection and/or a heated filament and/or steam.

Figure 5:
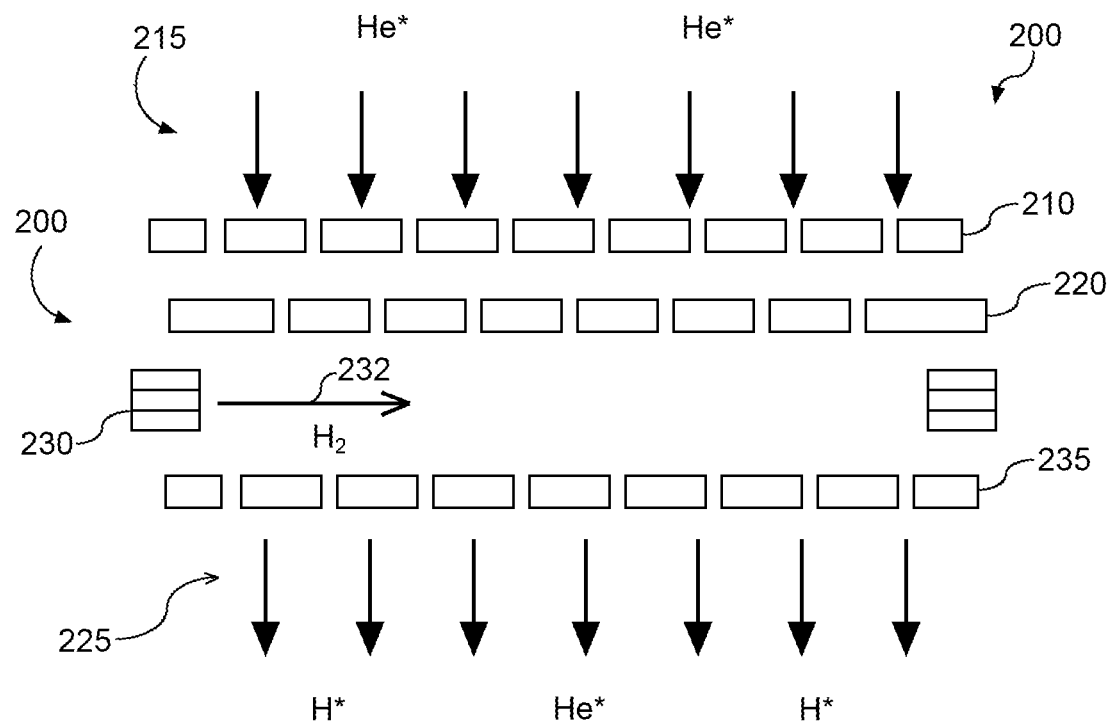
FIG. 5 depicts example generation of hydrogen radicals using post-plasma gas injection according to example embodiments of the present disclosure.

FIG. 5 depicts example generation of hydrogen radicals using post-plasma gas injection according to example embodiments of the present disclosure. More particularly, FIG. 5 depicts an example separation grid 200 for injection of hydrogen post-plasma according to example embodiments of the present disclosure. More particularly, the separation grid 200 includes a first grid plate 210 and a second grid plate 220 disposed in parallel relationship. The first grid plate 210 and the second grid plate 220 can provide for ion/UV filtering.

The first grid plate 210 and a second grid plate 220 can be in parallel relationship with one another. The first grid plate 210 can have a first grid pattern having a plurality of holes. The second grid plate 220 can have a second grid pattern having a plurality of holes. The first grid pattern can be the same as or different from the second grid pattern. Species (e.g., excited inert gas molecules) 215 from the plasma can be exposed to the separation grid 200. Charged particles (e.g., ions) can recombine on the walls in their path through the holes of each grid plate 210, 220 in the separation grid 200. Neutral species can flow relatively freely through the holes in the first grid plate 210 and the second grid plate 220.

Subsequent to the second grid plate 220, a gas injection source 230 can be configured to mix hydrogen 232 into the species passing through the separation grid 200. A mixture 225 including hydrogen radicals resulting from the injection of hydrogen gas can pass through a third grid plate 235 for exposure to the workpiece in the processing chamber.

The present example is discussed with reference to a separation grid with three grid plates for example purposes. Those of ordinary skill in the art, using the disclosures provided herein, will understand that more or fewer grid plates can be used without deviating from the scope of the present disclosure. In addition, the hydrogen can be mixed with the species at any point in the separation grid and/or after the separation grid in the processing chamber. For instance, the gas injection source 230 can be located between first grid plate 210 and second grid plate 220.

Figure 6:
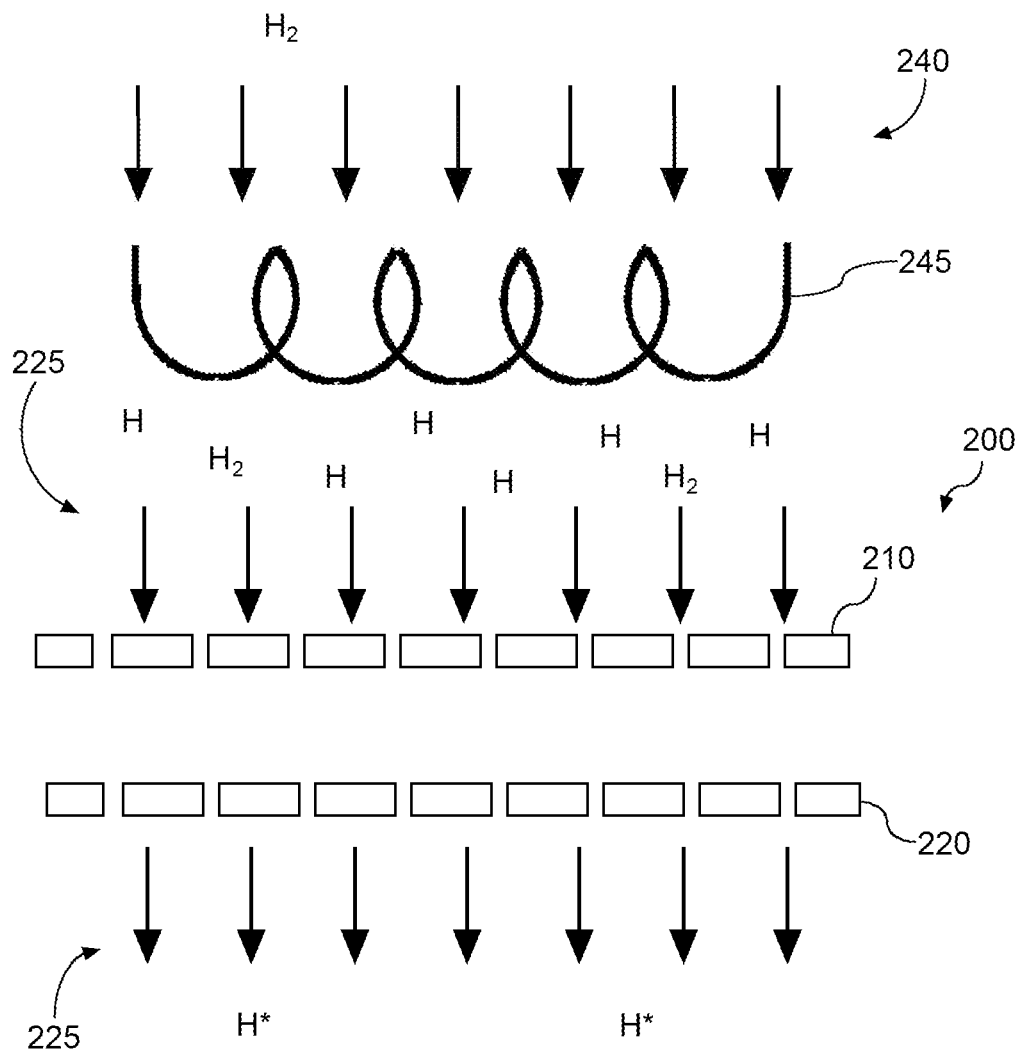
FIG. 6 depicts example generation of hydrogen radicals using a filament according to example embodiments of the present disclosure.

In some embodiments, the hydrogen radicals can be generated by passing a hydrogen gas over a heated filament (e.g., a tungsten filament). For example, as shown in FIG. 6, a hydrogen gas $H_2$ 240 can be passed over a heated filament 245 (e.g., a tungsten filament) to generate hydrogen radicals 225 in a first chamber. The hydrogen radicals 225 can be passed through a separation grid 200.

The separation grid 200 includes a first grid plate 210 and a second grid plate 220 disposed in parallel relationship. The first grid plate 210 can have a first grid pattern having a plurality of holes. The second grid plate 220 can have a second grid pattern having a plurality of holes. The first grid pattern can be the same as or different from the second grid pattern.

The defluorination process and/or plasma strip process can be implemented using other plasma processing apparatus without deviating from the scope of the present disclosure.

FIG. 7 depicts an example plasma processing apparatus 500 that can be used to implement processes according to example embodiments of the present disclosure. The plasma processing apparatus 500 is similar to the plasma processing apparatus 100 of FIG. 2.

More particularly, plasma processing apparatus 500 includes a processing chamber 110 and a plasma chamber 120 that is separated from the processing chamber 110. Processing chamber 110 includes a substrate holder or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of substrate 114 through a separation grid assembly 200.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gases (e.g., an inert gas) can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 7, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded.

As discussed above, a hydrogen gas can be injected into species passing through the separation grid 200 to generate one or more hydrogen radicals for exposure to the workpiece 114. The hydrogen radicals can be used to implement a variety of semiconductor fabrication processes.

The example plasma processing apparatus 500 of FIG. 7 is operable to generate a first plasma 502 (e.g., a remote plasma) in the plasma chamber 120 and a second plasma 504

(e.g., a direct plasma) in the processing chamber 110. As used herein, a "remote plasma" refers to a plasma generated remotely from a workpiece, such as in a plasma chamber separated from a workpiece by a separation grid. As used herein, a "direct plasma" refers to a plasma that is directly exposed to a workpiece, such as a plasma generated in a processing chamber having a pedestal operable to support the workpiece.

More particularly, the plasma processing apparatus 500 of FIG. 7 includes a bias source having bias electrode 510 in the pedestal 112. The bias electrode 510 can be coupled to an RF power generator 514 via a suitable matching network 512. When the bias electrode 510 is energized with RF energy, a second plasma 504 can be generated from a mixture in the processing chamber 110 for direct exposure to the workpiece 114. The processing chamber 110 can include a gas exhaust port 516 for evacuating a gas from the processing chamber 110. The hydrogen radicals used in the defluorination processes according to example aspects of the present disclosure can be generated using the first plasma 502 and/or the second plasma 504.

FIG. 8 depicts a processing chamber 600 similar to that of FIG. 2 and FIG. 7. More particularly, plasma processing apparatus 600 includes a processing chamber 110 and a plasma chamber 120 that is separated from the processing chamber 110. Processing chamber 110 includes a substrate holder or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of substrate 114 through a separation grid assembly 200.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gas (e.g., an inert gas) can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 8, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded.

The example plasma processing apparatus 600 of FIG. 8 is operable to generate a first plasma 602 (e.g., a remote plasma) in the plasma chamber 120 and a second plasma 604 (e.g., a direct plasma) in the processing chamber 110. As shown, the plasma processing apparatus 600 can include an angled dielectric sidewall 622 that extends from the vertical sidewall 122 associated with the remote plasma chamber 120. The angled dielectric sidewall 622 can form a part of the processing chamber 110.

A second inductive plasma source 635 can be located proximate the dielectric sidewall 622. The second inductive plasma source 635 can include an induction coil 610 coupled to an RF generator 614 via a suitable matching network 612. The induction coil 610, when energized with RF energy, can induce a direct plasma 604 from a mixture in the processing chamber 110. A Faraday shield 628 can be disposed between the induction coil 610 and the sidewall 622.

The pedestal 112 can be movable in a vertical direction V. For instance, the pedestal 112 can include a vertical lift 616 that can be configured to adjust a distance between the pedestal 112 and the separation grid assembly 200. As one example, the pedestal 112 can be located in a first vertical position for processing using the remote plasma 602. The pedestal 112 can be in a second vertical position for processing using the direct plasma 604. The first vertical position can be closer to the separation grid assembly 200 relative to the second vertical position.

The plasma processing apparatus 600 of FIG. 8 includes a bias source having bias electrode 510 in the pedestal 112. The bias electrode 510 can be coupled to an RF power generator 514 via a suitable matching network 512. The processing chamber 110 can include a gas exhaust port 516 for evacuating a gas from the processing chamber 110. The hydrogen radicals used in the defluorination processes according to example aspects of the present disclosure can be generated using the first plasma 602 and/or the second plasma 604.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for processing a workpiece, the method comprising:
supporting a workpiece on a workpiece support, the workpiece having a photoresist layer, the workpiece having one or more fluorine residuals on a surface of the workpiece, wherein the workpiece comprises a metal layer;
performing a defluorination process on the workpiece at least in part using a plasma generated from a first process gas, the first process gas comprising a hydrogen gas;
subsequent to performing the defluorination process, performing a plasma strip process on the workpiece to at least partially remove the photoresist layer from the workpiece,
wherein the defluorination process comprises exposing the workpiece to one or more hydrogen radicals.

2. The method of claim 1, wherein performing the defluorination process comprises:
generating the one or more hydrogen radicals in a plasma chamber from the first process gas using a plasma source;
filtering ions generated using the plasma with a separation grid separating the plasma chamber from a processing chamber;
exposing the workpiece to the hydrogen radicals in the processing chamber.

3. The method of claim 1, wherein the first process gas further comprises a carrier gas, wherein the carrier gas comprises nitrogen or an inert gas.

4. The method of claim 1, wherein the plasma strip process comprises:
generating one or more species in a plasma chamber from a second process gas using a plasma source;
filtering ions using a separation grid separating the plasma chamber from a processing chamber to allow the passage of one or more neutral radicals;
exposing the workpiece to one or more neutral radicals in the processing chamber;
wherein the second process gas comprises oxygen.

5. The method of claim 1, wherein the defluorination process is implemented for a treatment time, the treatment time being in the range of about 5 seconds to about 60 seconds.

6. The method of claim 1, wherein the defluorination process is conducted at a process pressure in the processing chamber, the process pressure being in the range of about 300 mT to about 4000 mT.

7. The method of claim 1, wherein the defluorination process is conducted at a source power, the source power being in the range of about 600 W to about 5000 W.

8. The method of claim 1, wherein the defluorination process is conducted with the workpiece at a process temperature, the process temperature being in the range of about 90° C. to about 400° C.

9. The method of claim 1, wherein a ratio of hydrogen gas to one or more carrier gases in the first process gas is about 2 to about 100.

10. The method of claim 4, wherein the second process gas comprises oxygen and nitrogen.

11. The method of claim 1, wherein the metal layer comprises tungsten.

12. The method of claim 1, wherein the fluorine residuals result from an etch process.

13. The method of claim 2, wherein the hydrogen radicals react with the one or more fluorine residuals to generate an HF gas.

14. The method of claim 13, further comprising pumping the HF gas from the processing chamber prior to performing the plasma strip process.

15. A method for implementing a defluorination process on a workpiece, the workpiece comprising a photoresist layer and a metal layer, the workpiece having one or more fluorine residuals on the workpiece, the method comprising:
supporting the workpiece on a workpiece support in a processing chamber;
generating one or more hydrogen radicals;
exposing the one or more hydrogen radicals to the workpiece to react the hydrogen radicals with the one or more fluorine residuals and generate an HE gas;
evacuating the HF gas from the processing chamber;
wherein the one or more hydrogen radicals are generated by mixing a hydrogen gas with one or more excited inert gas molecules downstream of a plasma source.

16. The method of claim 15, wherein the processing chamber is separated from the plasma source by a separation grid, the hydrogen gas being mixed with one or more excited inert gas molecules at or below the separation grid.

* * * * *